United States Patent
von Bünau et al.

(10) Patent No.: US 6,784,977 B2
(45) Date of Patent: Aug. 31, 2004

(54) PROJECTION EXPOSURE SYSTEM AS WELL AS A PROCESS FOR COMPENSATING IMAGE DEFECTS OCCURING IN THE PROJECTION OPTICS OF A PROJECTION EXPOSURE SYSTEM, IN PARTICULAR FOR MICROLITHOGRAPHY

(75) Inventors: Rudolf von Bünau, Essingen (DE); Christian Hembd-Söllner, Stuttgart (DE); Hubert Holderer, Königsbronn (DE)

(73) Assignee: Carl Zeiss Semiconductor Manufacturing Technologies AG (DE)

(*) Notice: Subject to any disclaimer, the term of this patent is extended or adjusted under 35 U.S.C. 154(b) by 0 days.

(21) Appl. No.: 10/133,963

(22) Filed: Apr. 25, 2002

(65) Prior Publication Data

US 2003/0002023 A1 Jan. 2, 2003

(30) Foreign Application Priority Data

Apr. 26, 2001 (DE) .......................................... 101 20 446

(51) Int. Cl.[7] .............................................. G03B 27/54
(52) U.S. Cl. .......................................... 355/67; 355/53
(58) Field of Search ............................ 355/52, 53, 55, 355/60, 62, 67

(56) References Cited

U.S. PATENT DOCUMENTS

| | | | | |
|---|---|---|---|---|
| 4,851,882 A | * | 7/1989 | Takahashi et al. | ............. 355/46 |
| 5,757,505 A | * | 5/1998 | Mizutani | .................... 356/400 |
| 6,166,865 A | * | 12/2000 | Matsuyama | .................. 355/53 |
| 6,233,042 B1 | * | 5/2001 | Kanda | ......................... 355/53 |
| 6,381,077 B1 | * | 4/2002 | Jeong et al. | .................. 355/53 |
| 6,388,823 B1 | | 5/2002 | Gaber et al. | |

FOREIGN PATENT DOCUMENTS

| | | | |
|---|---|---|---|
| DE | WO/99/67683 | * | 12/1999 |
| DE | 198 24 030 A1 | | 12/1999 |
| JP | 2000-114145 | | 4/2000 |
| WO | WO 00/55890 | | 9/2000 |

* cited by examiner

Primary Examiner—Alan Mathews
(74) Attorney, Agent, or Firm—Factor & Lake

(57) ABSTRACT

A projection exposure system, in particular for microlithography, serves for the generation of an image in an image plane of an object arranged in an object plane. The system comprises a light source that emits a projection light bundle. The system also comprises a projection optics arranged in the optical path between the object plane and the image plane as well as at least one optical correction component arranged in the projection light optical path in front of the image plane. In order to change the optical image properties this component is coupled to at least one correction manipulator so that an optical surface of the optical correction component illuminated by the projection light bundle is moved at least regionally. In this connection the correction manipulator operates together with a correction sensor device. The correction sensor device comprises a light source that emits at least one measuring light bundle. This light bundle passes through at least a part of the projection optics and lie sin front of the entry point to and after the exit from the projection optics outside the projection light bundle. The correction sensory device also has a position-sensitive correction sensor element for the detection of the wave front of the at least one measuring light bundle. By means of the correction sensor device a correction of image defects of the projection optics is ensured without the loss of projection light.

12 Claims, 3 Drawing Sheets

PROJECTION EXPOSURE SYSTEM AS WELL AS A PROCESS FOR COMPENSATING IMAGE DEFECTS OCCURING IN THE PROJECTION OPTICS OF A PROJECTION EXPOSURE SYSTEM, IN PARTICULAR FOR MICROLITHOGRAPHY

BACKGROUND OF THE INVENTION

The invention relates to a projection exposure system, in particular for microlithography, for producing an image in an image plane of an object arranged in an object plane with a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator cooperates with a correction sensor device in order to determine the optical image properties in the projection.

The invention furthermore relates to a process for compensating image defects occurring in the projection optics of a projection exposure system, in particular for microlithography.

A projection exposure system and a process of the type mentioned in the introduction are known from DE 198 24 030A1. There a wave front sensor is provided that is arranged in the region of the image plane. This sensor either operates in the exposure pauses or, in a manner that is not described, during the exposure. If the sensor is operated in the exposure pauses, then this reduces the throughput of the projection exposure system. If on the other hand such a sensor is employed during the exposure, the projection light absorbed by the sensor may not simultaneously serve for the projection exposure of the wafer. This reduces the lighting efficiency of the projection exposure system.

SUMMARY OF THE INVENTION

The object of the present invention is accordingly to develop a projection exposure system of the type mentioned in the introduction so that image defects can be corrected while at the same time achieving a high projection efficiency.

This object is achieved according to the invention in that the correction sensor device comprises:

a) a light source that emits at least one measuring light bundle that traverses at least a part of the projection optics and that lies in front of an entry to the projection optics and behind an exit from the projection optics outside the projection light bundle, b) a position-sensitive correction sensor element for detecting the wave front of the at least one measuring light bundle.

The use of measuring light independently of the projection light ensures that the projection light can be used without loss for the lighting of the wafer.

Depending on the requirements placed on the accuracy of the determinations of the image defects, the greatest possible aperture region of the projection optics is traversed by the measuring light. Several measuring light bundles may also be used to provide a broader utilization of the aperture of the projection optics.

The generation of the measuring light bundle and of the projection light bundle may take place independently. For the measuring light there may therefore be used for example light of a specific wavelength that can be detected with a high degree of sensitivity using known sensors and that also does not interfere in the projection procedure if for example measuring light reflections reach the region of the image, Furthermore, all the projection light is available for the projection procedure.

Alternatively the measuring light bundle may be split off from the projection light bundle. As a rule a small proportion of the light output that is made available by the light source emitting the projection light is sufficient as measuring light for the correction sensor element. Accordingly a reflection of the projection light bundle may for example be split off and used as measuring light bundle without thereby causing any noticeable loss of light output of the projection light. The projection and the correction sensor device can therefore be operated with only one light source.

The projection optics may be designed so that it contains at least one intermediate image plane, and the correction sensor element may lie in the intermediate image plane or in a plane conjugated thereto. In this case the intensity distribution of the measuring light incident on the correction sensor element corresponds to that in the image plane, with the result that the determination of image defects can easily be performed. Moreover, in the region of the intermediate image plane a simple separation of the measuring light bundle from the projection light bundle can be performed since the projection light bundle is concentrated here, with the result that the measuring light bundle can be passed to the correction sensor device, while the projection light bundle is fully available for the projection.

A preferred embodiment comprises at least one optical decoupling element for decoupling the measuring light bundle from the projection light bundle in the region of an intermediate image plane and/or a plane conjugated there to. Such a decoupling element facilitates the separation of the at least one measuring light bundle from the projection light bundle.

The decoupling element may be a mirror. Decoupling mirrors may be produced in any suitable size, and in particular their size and optical strength may be matched exactly to the geometrical relationships for the decoupling of the measuring light bundle from the projection light bundle. Furthermore a decoupling mirror can be manufactured having a high surface quality of the reflecting surface, with the result that no additional image defects are produced.

The correction sensor device as well as the at least one correction manipulator may be designed so that they operate during the projection exposure. This increases the throughput of the projection exposure system since the projection exposure need not be interrupted for correction purposes.

The correction sensor device may comprise a wave front sensor. A determination of for example Seidel image defects may be carried out in a simple manner using such a sensor.

The position-sensitive correction sensor element may be a CCD array. A CCD array has a high position resolution and a high quantum efficiency.

The correction sensor device may include an adjustment manipulator for adjusting the correction sensor device relative to the projection optics. This permits the use of a pre-adjusted correction sensor device in conjunction with a plurality of projection objective lenses. This is particularly advantageous if the projection exposure system operates in a fixed cyclical mode and image defects of the projection optics that are to be corrected are always repeated within a cycle. In this case the correction sensor device need be coupled to the projection exposure system only during a first cycle in order to set adjustment values for the correction manipulator, while an adjustment program stored in the first cycle can be accessed in the subsequent cycles. In these subsequent cycles the correction sensor device may be used to adjust other projection exposure systems. For this purpose the correction sensor device is adjusted in each case with the aid of the adjustment manipulator.

An active mirror may be used as correction component. This mirror may comprise a plurality of mirror facets that maybe displaced independently of one another using correction manipulators or may also comprise a deformable reflecting surface. Finally, it is also possible to use an active lens. Such active components are described for example in U.S. Pat. No. 6,388,823, which is incorporated herein by reference, and are suitable for correcting image defects of any arbitrary symmetry.

Alternatively or additionally, a correction component may comprise a lens that is designed so that it can be displaced using the correction manipulator. More specifically, a lens may be provided that can be displaced in the direction of its optical axis. Alternatively or additionally a lens may be employed that can be displaced perpendicular to its optical axis. The use of such manipulable lenses for correcting various aberrations is known. Such a correction component is easy and inexpensive to fabricate.

A further object of the present invention is to develop a process of the type mentioned in the introduction in such a way as to ensure an efficient and at the same time image-corrected projection exposure.

This object is achieved according to the invention by a process having the following process steps:

a) providing at least one measuring light bundle guided through at least a part of the projection optics independently from the projection light bundle;

b) measuring of the optical properties of the measuring light bundle after the at least partial passage through the projection optics;

c) comparing the measured value with at least one predetermined desired value;

d) adjusting the measured optical property depending on the comparison with at least one correction component influencing the said optical property.

The advantages of this process according to the invention correspond to the advantages described above of the projection exposure system according to the invention.

The steps a) to d) may be repeated periodically during the projection exposure.

With such a process occurring image defeats can be corrected during the projection exposure without having to interrupt the projection exposure procedure. At the same time, since the at least one measuring light bundle is used to measure the image defects, the whole projection light bundle is available for the projection.

Preferably the wave front of the measuring light bundle is measured in an intermediate image plane or in a plane conjugated thereto. Measuring values that are simple to evaluate are accordingly available for occurring image defects.

An advantageous embodiment of the process comprises the following steps;

a) determining a deviation between a desired reflecting surface and an actual reflecting surface of a mirror of the projection optics, from the measured values;

b) calculating adjustment values for the actual reflecting surface;

c) shaping the actual reflecting surface corresponding to the calculated adjustment values.

The adjustment of a mirror performed according to the calculated correction ensures, depending on its position, a precise influencing of specific occurring image defects. Depending on whether the mirror is positioned close to the field or close to the aperture diaphragm, errors can be corrected that are selective or otherwise relative to various field points. Methods for influencing the shape of the reflecting surface of a mirror are known and comprise influencing rotationally symmetrical shapes as well as influencing shapes of arbitrary symmetry.

A further preferred embodiment of the process comprises the following steps:

a) determining a deviation between a desired position and an actual position of a displaceable lens of the projection objective lens;

b) calculating adjustment values for the actual position;

c) displacing the actual position corresponding to the calculated adjustment values.

Here too a predeterminable influencing of specific image defects is possible corresponding to the position of the displaceable lens. In this connection the lens may be chosen so that only a specific image defect is predominantly influenced, while other types of defect remain unaffected. Alternatively the displacement of the lens can also influence more than one image defect. Of course, several lenses may also be displaced, in which connection for example the displacement of the individual lenses is carried out in such a manner that specific image properties are changed in a predetermined magnitude, while changes in other image properties are compensated exactly by the lens displacements.

The adjustment of the optical property may be carried out while taking into account in addition expected image defects of optical components that influence the projection light bundle but not the measuring light bundle. The behavior of the optical components in that part of the projection optics not traversed by the measuring light bundle can be extrapolated from the number and type of the optical components through which the measuring light bundle passes. On the basis of this extrapolation the image defect of the projection optics can be influenced via the adjustment of the correction manipulator in such a way that not only are the image defects of the optical components through which the measuring light bundle passes corrected, but the overall result is that the projection optics is free of image defects. A further possibility is to load the projection optics with the respective lighting settings and then measure the image defects. In this way the image defects of the projection optics can be determined depending on the defects in the region traversed by the measuring light bundle.

The presetting of the desired value may be made depending on a lighting setting. Known lighting settings of this type have for example a homogeneous or also an annular lighting intensity in an aperture diaphragm plane of the projection optics. Lighting intensity distributions having multiple symmetry in the aperture diaphragm plane of the projection optics may also be employed. Depending on the geometry and symmetry of the lighting setting, a lighting-induced image defect of corresponding geometry and symmetry may result. With a known lighting setting an adjustment with the corresponding symmetry may therefore be effected on the basis of the measuring values of the correction sensor device.

The presetting of the desired value may be made depending on the type of object. The transmission of the object, for example a reticule in microlithography, may influence the resulting image defect in the projection optics. If the type of object is known, this may appropriately be taken into account in the correction of the image defects.

BRIEF DESCRIPTION OF THE DRAWINGS

Embodiments of the invention will now be described in more detail hereinafter with the aid of the drawings, in which.

DETAILED DESCRIPTION OF THE DRAWINGS

Figure 1:
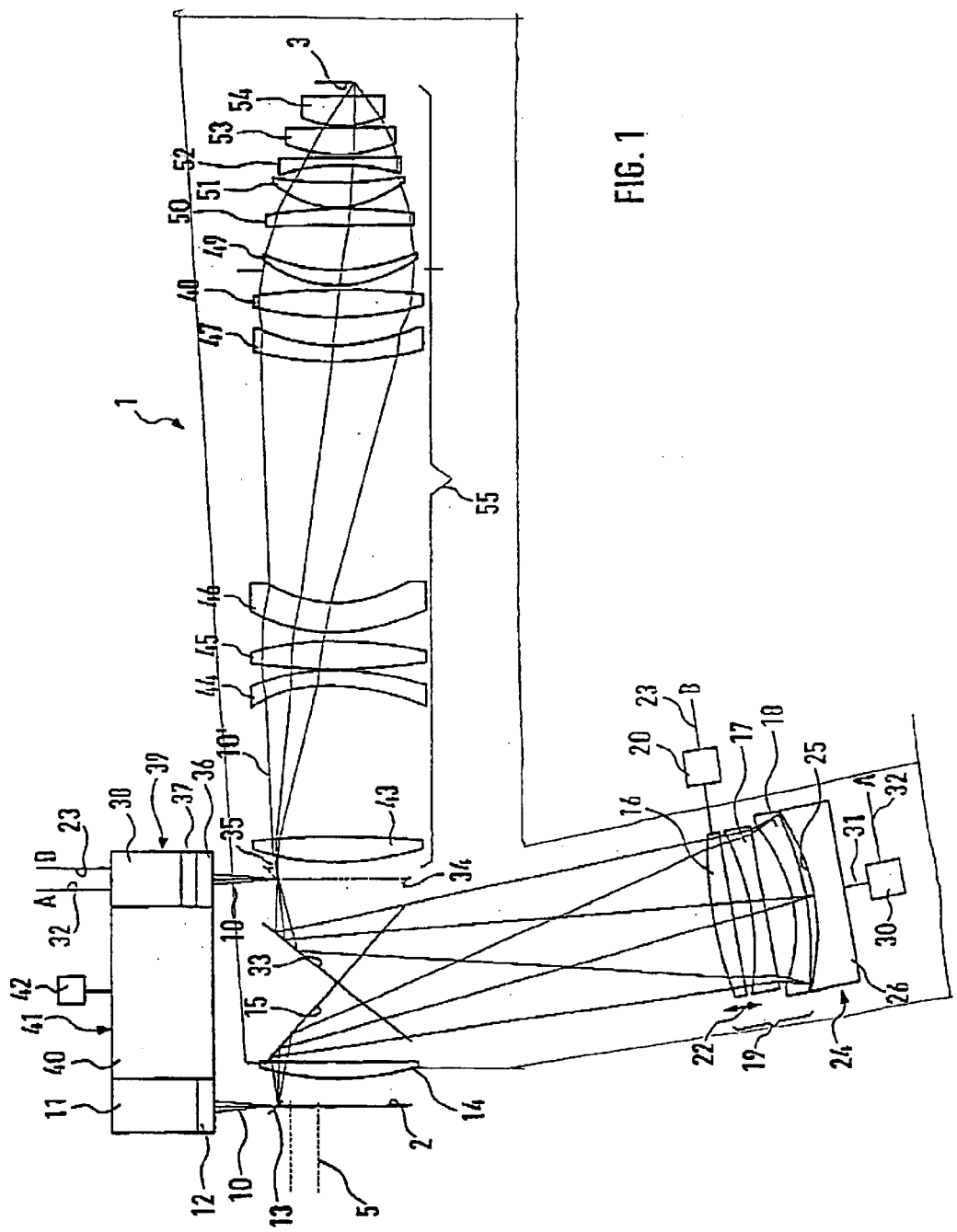
FIG. 1 shows a catadioptric projection objective lens for microlithography with a measuring and correction device for optical image defects.

Using the projection objective lens illustrated in ameridional section in FIG. 1 and denoted overall by the reference numeral 1, an image of a structure located on a reticule is formed on a reduced scale on a wafer. The reticule (not shown) is arranged in an object plane 2 and the wafer (likewise not shown) is arranged in an image plane 3. In the operation of the projection exposure system to which the projection objective lens 1 belongs, both the reticule in the object plane 2 as well as the wafer in the image plane 3 are synchronously scanned.

Figure 2:
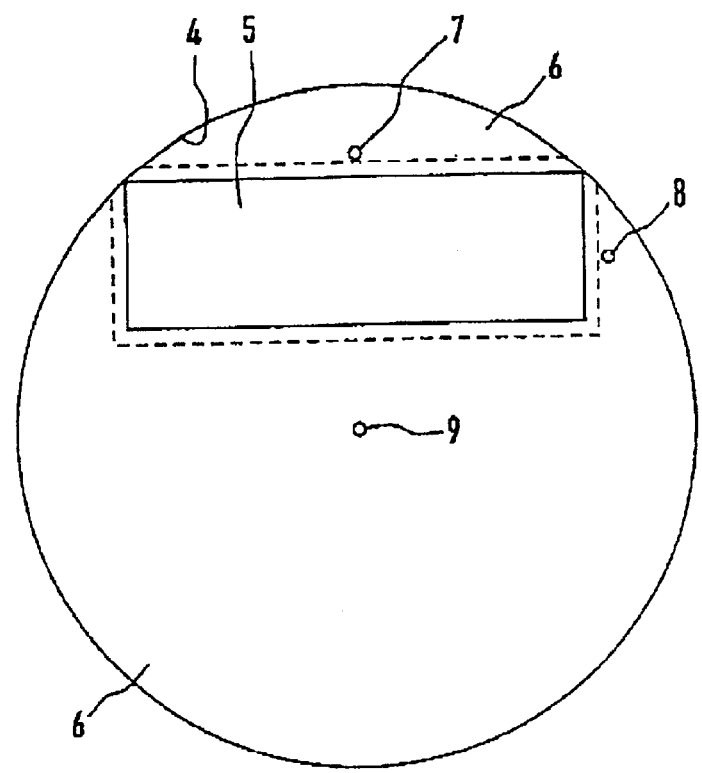
FIG. 2 is a section illustrating the lighting relationships in the object plane of the projection objective lens of FIG. 1.

The lighting relationships in the object plane 2 are illustrated in FIG. 2. In this connection bundle cross-sections are illustrated disregarding any possible deflection, i.e. are shown possibly unfolded, in the region of the object plane 2.

The projection objective lens 1 has a circular corrected object field 4 with a diameter of ca. 162 mm. An object field arranged eccentrically from the optical axis of the projection objective lens 1 is traversed by a rectangular projection light bundle 5 with a ratio of the sides of 35 mm to 110 mm, which irradiates the structure on the reticule (not shown). The longitudinal side of the projection light bundle 5 adjacent to the optical axis is at a distance of 24.5 mm from the latter. The projection light bundle 5 is generated by a UV laser, for example a F2 laser with wavelength of 157.13 nm, which is not shown in the diagram and whose light has traversed a corresponding lighting optics system. An ArF laser with an output at 193.3 nm may for example also be used as light source for projection light.

Since on account of the beam guidance in the projection objective lens 1 not all the corrected object field 4 can be utilized, two field sections 6 outside the projection light bundle 5 remain within the corrected object field 4 in the object plane 2 with a tolerance interspacing (to be explained hereinafter) around the projection light bundle 5. These field sections are traversed by three circular measuring light bundles 7 to 9 that have a diameter of ca. 2 mm in the object plane.

The first measuring light bundle 7 lies on the side of the projection light bundle 5 remote from the optical axis and is adjacent to the middle of a longitudinal side of the latter. The distance from the center of the measuring light bundle 7 in the object plane 2 to the optical axis is 65 mm. The second measuring light bundle 8 is adjacent to the middle of a narrow side of the projection light bundle 5. The third measuring light bundle 9 runs alongside the optical axis. Overall, information is obtained by the three measuring light bundles 7 to 9 from a relatively large region of the upper half of the corrected object field 4 in FIG. 2.

In principle the remaining field sections 6 can also be covered by measuring light, for example by a plurality of measuring light bundles. The tolerance interspacing of the field sections 6 around the projection light bundle 5 in the object plane 2 takes into account in this connection the shadow effect due to optical elements for the coupling of the measuring light bundles, so that the projection light bundle 5 can pass unhindered through the projection optics. The projection light bundle 5 is shown by dotted lines in FIG. 1 only in the region of the entry point to the projection objective lens 1.

The arrangement of the optical components of the projection objective lens 1 is quantitatively reproduced in the appendix in Table 1. This is produced in a known standard format for optical design, namely the format code V. The design of the projection objective lens 1 corresponds to the fifth embodiment in U.S. application Ser. No. 60/173,523, incorporated herein by reference.

The consecutive numbers of the first column in Table 1 denote the optical surfaces (OBJ) of the projection objective lens 1. The object plane 2 corresponds for example to the optical surface with the consecutive number 2. In the second column a radius of curvature (RDY) is allocated to the surfaces. The value in the third column is a measure of the distance (THI) of the respective optical surface from the in each case preceding optical surface, measured along the optical axis.

The projection objective lens 1 in the Y-Z plane of the code V format is shown in FIG. 1. The column-type description of the optical surfaces in Table 1 is interrupted at certain optical surfaces by additional parameter data which will be explained hereinafter.

XDE, YDE and ZDE denote displacements of the in each case preceding optical surface in the X, Y and Z directions. ADE, BDE and CDE denote the tilting of the in each case preceding optical surface about the X, Y and Z axis.

ASP denotes a preceding a spherical surface that is described by subsequent parameters in the table that are used in the code V a spherical formula.

The refractive components of the projection objective lens 1 are made from CaF2. At a wavelength of 157.13 nm CaF2 has a refractive index of 1.55971.

The optical path of the measuring light through the projection objective lens 1 will now be described with the aid of FIG. 1. In this connection a measuring light partial bundle 10 that traverses a point on the object plane 2 lying centrally in the measuring light bundle 7 (not illustrated in FIG. 1; see FIG. 2) serves for purposes of illustration. This partial bundle is generated by a measuring light source 11, for example a helium-neon laser having a wavelength of 632.8 nm. The measuring light bundles 8 and 9 (not shown in FIG. 1) are generated by separate measuring light sources.

An optics system 12 for shaping the optical path, for example an adjustable zoom objective, serves to shape the bundle of the measuring light bundle 7 emitted by the measuring light source 11, so that the measuring light partial bundle 10 is matched to the projection objective lens 1. This matching means that a position on which the measuring light partial bundle 10 and thus the whole measuring light bundle 7 is collimated, lies in the region of the object plane 2. Also the divergence of the measuring light partial bundle 10 and thus of the whole measuring light bundle 7 is matched to the numerical aperture of the projection objective lens 1. The measuring light bundles 8 and 9 are matched in the same way.

The measuring light partial bundle 10 runs from the optics system 12 shaping the optical path first of all parallel to the object plane 2 and is deflected by approximately 90 in the direction of the projection objective lens 1 by a coupling mirror 13. The coupling mirror 13 is more specifically arranged so that the location of the reflection of the measuring light partial bundle 10 lies in the object plane 2.

After reflection at the coupling mirror 13 the measuring light partial bundle 10 first of all passes through a lens 14 having a positive refractive power adjacent to the object plane 2. The partial bundle is then reflected from the reflecting surface of a first plane mirror 15 in the plane of the drawing of the FIG. 1 at an obtuse angle in the direction of a group of lenses 19 consisting of three individual lenses 16, 17, 18.

The individual lens 16, that is first traversed by the bundle, is associated with a drive device 20. By means of the latter the individual lens 16 can be displaced in the direction of its optical axis, as illustrated in FIG. 1 by the double arrow 22. The drive device 20 is controlled by a control line 23, as will be described hereinafter.

The measuring light partial bundle 10 after a first passage trough the group of lenses 19 strikes a concave active mirror 24. This has a reflecting layer 25 that is supported by a supporting body 26.

Figure 3:
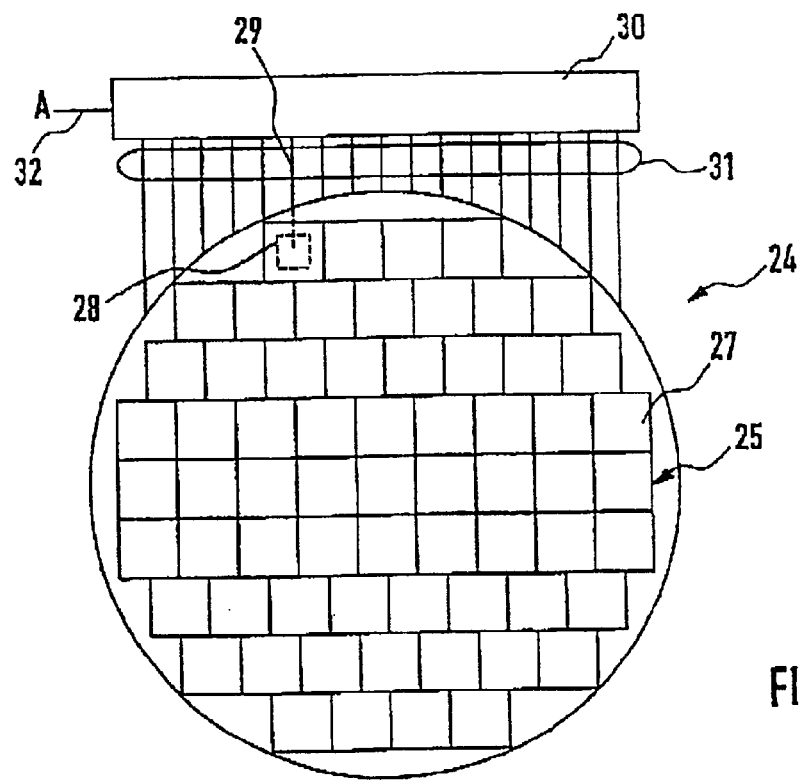
FIG. 3 is a view of an active mirror employed in the projection objective lens of FIG. 1.

FIG. 3 shows in more detail the active mirror 24: the reflecting layer 25 of the active mirror 24 is subdivided into a multiplicity of square mirror facets 27. A correction actuator 28 that is shown diagrammatically by dotted lines in FIG. 3 only for one mirror facet 27 is arranged on the side of the mirror facet 27 remote from the reflecting layer 25.

The correction actuators 28 of the mirror facets 27 are connected in each case via a control line 29 to a multiplex 30. In FIG. 1 all control lines 29 are combined into a control line bundle 31.

The control information is passed to the multiplex 30 via a control line 32 in a manner that will be described hereinafter.

The refractive power of the lens 14 and of the group of lenses 19 is such that the reflecting layer 25 of the active mirror 24 lies in the region of an aperture diaphragm plane of the projection objective lens 1. The measuring light partial bundle 10 belonging to a point in the object plane 2 thus occupies practically the whole aperture of the reflecting layer 25.

After reflection at the reflecting layer 25 the measuring light partial bundle 10 traverses for the second time the group of lenses 19. The partial bundle is then reflected by the reflecting surface of a second plane mirror 33 in the plane of the drawing so that the solid beam of the measuring light partial bundle 10 is deflected by ca. 90.

After the reflection at the plane mirror 33 the projection objective lens 1 has an intermediate image plane 34 in the optical path. A decoupling mirror 35 (shown by dotted lines) is arranged in this intermediate plane so that the position of the reflection of the measuring light partial bundle 10 lies in the said intermediate image plane 34.

The decoupling mirror 35 lies outside the projection light bundle 5 (not shown) within the projection objective lens 1. After reflection at the decoupling mirror 35 the solid beam of the measuring light partial bundle 10 runs parallel to the solid beam of the measuring light partial bundle 10 before the coupling mirror 13. After the decoupling mirror 35 the measuring light partial bundle 10 passes through a detection optics system 36 and strikes a two-dimensional CCD array 37 that is arranged perpendicular to the incident solid beam of the measuring light partial bundle 10.

The two-dimensional intensity distribution of the measuring light bundle 7 measured with the CCD array 37 is passed to a correction computer 38. The correction computer 38 communicates with the multiplex 30 via the control line 32 (connection A—A). The correction computer 38 communicates with the drive device 20 via the control line 23 (connection B—B).

The overall detector unit 39, which comprises the detection optics system 36, the CCD array 37 as well as the correction computer 38, is arranged together with the measuring light source 11 and the beam guidance optics 12 on a displaceable table 40 and forms together with these components a correction sensor optics device 41.

The displacement table 40 may be displaced by means of a drive device 42 in the direction of the coupled and/or decoupled measuring light partial bundle 10.

In an alternative embodiment the measuring light bundle 10 is decoupled not in the region of the intermediate image plane 34 but in the region of the image plane 3. The correction sensor device in this case collects the image properties of all optical components within the projection objective lens 1. In order to illustrate the measuring light bundle 10' in the projection objective lens 1 in this alternative embodiment, the further trajectory of the measuring light bundle 10' is also shown after the decoupling mirror 35. The decoupling as well as the correction sensor device are not shown in this alternative.

The optical path of the projection light bundle 5 is similar to the illustrated alternative optical path of the measuring light bundle 10'.

After traversing the lens 14 and reflection at the first plane mirror 15, the projection light bundle 5 passes backwards and forwards through the group of lenses 19, a reflection at the reflecting layer 25 of the active mirror 24 taking place between the forward passage and the return passage. After the return passage through the group of lenses 19 the projection light bundle 5 is reflected at the second plane mirror 33 and then passes through a group of lenses 55 consisting of twelve individual lenses 43 to 54. An image of the projection light bundle 5 is formed in the image plane 3 by the group of lenses 55.

In conjunction with the active mirror 24 the correction sensor device 41 constitutes a measuring and correction device for image defects that occur in the projection objective lens 1. This measuring and correction device functions as follow: an image of the region of the intermediate image plane 34 traversed by the measuring light bundle 7 is formed on the CCD array 37 by means of the detection optics 36. Information about the wave front of the measuring light bundle 7 can therefore be obtained from the intensity distribution on the CCD array 37. The measured wave front information is compared with a desired value of the wave front in order to determine a wave front deviation. This comparison procedure is carried out in the correction computer 38. The computer also calculates, on the basis of the comparison value, how the position and/or the shape of the reflecting layer 25 must be altered so that the measured actual wave front is converted into the desired wave front. In addition the computer calculates to what extent a displacement of the individual lens 16 along the double arrow 22 further reduces the difference between the actual value and the desired value of the wave front. The calculated predetermined values for the displacement of the individual mirror facets 27 and for the displacement of the individual lens 16 are transmitted via the control lines 32 and 23 to the multiplex 30 and the drive device 20.

The transmission to the control line 32 is performed in a digitally coded manner in such a way that in the multiplex 30 the control data can be allocated to the individual mirror facets 27 so that these can be manipulated independently of one another. These control data are then transmitted via the control line bundle 31 to the correction actuators 28 of the individual mirror facts 27. With the aid of the correction actuators 28 it is possible, depending on the transmitted control data, to adjust the inclination of the individual mirror facets 27 and to displace the mirror facets 27 in the direction of the optical axis. For this, each correction actuator 28 has a plurality of independently controllable piezoelements.

A deformation of the reflecting layer 25 according to the adjustment values predetermined via the control line 32 takes place through the independent adjustment of the mirror facets 27. This deformation is reflected as a change in the image properties of the projection objective lens 1.

Via the control line 23 the drive device 20 is controlled by the correction computer 38 for the displacement of the individual lens 16 corresponding to the associated adjustment value in the direction of the double arrow 22. The drive device 20 may also have a plurality of piezoelements. Such drive devices for displacement of lenses are known. The image properties of the projection objective lens 1 are also altered by the lens displacement In principle two different modes of operation of the described measuring and correction device are possible; in a first mode of operation optical image defects that are generated by the optical components, which are subjected both to the measuring light bundles 7 to 9 (see as atypical example the measuring light partial bundle 10 of the measuring light bundle 7 in FIG. 1) as well as to the projection light bundle 5, are compensated by the measuring and correction device. These are the optical components 14 to 18, 25 as well as 33.

In a second mode of operation an extrapolation can be made via the image defects to be expected in the overall projection objective lens 1, on the basis of the measured deviation of the wave front. The contribution of the lens surfaces of the lens group 55 that have not been included is then added to the measured wave front deviation. The drive device 20 as well as the active mirror 24 are controlled by the correction computer 38 in such a way as to compensate the extrapolated overall wave front deviation.

The adjustment of optical image properties of the projection objective lens 1 according to the described modes of operation is carried out during the projection exposure. This is possible since the coupling and decoupling of the measuring light bundles 7 to 9 can take place without interfering with the projection light bundle 5. From the illustration shown in FIG. 2 it becomes clear in particular that a sufficient interspacing can be maintained between the measuring light bundles 7 to 9 and the projection light bundle 5 in the object plane 2 and thus also in the intermediate image plane 34 conjugated thereto. For this, the coupling mirror 13 and the decoupling mirror 35 need only be made sufficiently thin and narrow.

So as to obtain information that is as relevant as possible on the wave front change, a total of three measuring light bundles 7 to 9 distributed over the object field are used, as illustrated in FIG. 2, so that a distinction can be made between image defects that are present in the regions of the projection objective lens 1 close to the field and close to the aperture diaphragm: measuring light bundles 7 to 9 whose wave fronts are affected in the same way indicate that there is an image defect in the region of an aperture diaphragm plane. If the measuring light bundles 7 to 9 are affected indifferent ways however, this indicates that there is an image defect in the region of a field plane.

The measuring light bundles 7 to 9 may either be deflected jointly using a coupling mirror and a decoupling mirror, or may also be coupled and decoupled separately using in each case associated mirrors.

The various measuring light bundles 7 to 9 may either be measured jointly using the same detector unit 39, or detector units that are allocated to the individual measuring light bundles 7 to 9 may be employed. The measuring data obtained by means of the latter alternative are then processed in a main computer that receives the data from the individual correction computers 38, and converted into signal data for the drive device 20 as well as the correction actuators 28.

A Shack-Hartmann sensor may be used as sensor for measuring the wave front of the measuring light bundles 7 to 9. With such a wave front sensor the aperture diaphragm is subdivided and the tilting of the wave front is measured locally. For this, an image of the wave front is formed with a lens array on a detector array, for example a CCD array. The tilting of the wave front at the respective lens can be calculated from the measured deviation of the foci of the individual lenses in the detector plane from the desired positions, which would correspond to an untilted wave front at the site of the respective lens. The wave front is then found by integration over the whole array.

Depending on the nature of the image defects to be corrected, i.e. depending on whether the projection exposure system quickly reaches a stationary state or not with respect to its image defects, the measuring and correction device operates either within the framework of an initialization procedure in the initial operation of the projection exposure system, or operates continuously. In the case of a continuous process the change of the wave front is measured at predetermined time intervals, and a displacement of the individual lens 16 and/or of the mirror facets 27 is carried out dependent on the results. Since the cycle time depends only on the computational speed of the correction computer 38, the control speed of the drive device 20 and the inertia of the correction actuators 28, a rapid succession of cycles is possible in order also to be able to compensate relatively rapidly occurring image defects, for example lighting-induced defects.

Other data apart from the wave front measuring value and the extrapolation information described hereinbefore, which anticipates image defects in optical components not traversed by the measuring light, can also be incorporated in the adjustment values that are calculated by the correction computer 38. Examples of this are data that are obtained from the predetermined lighting setting, i.e. from the intensity distribution of the projection light bundle 5 in an aperture diaphragm plane of the projection objective lens 1. The symmetry of the chosen lighting setting may for example produce certain symmetries in the image defects that occur. Using such symmetry information adjustment values can be calculated for image defects that are present in components not traversed by the measuring light bundles.

The reticle structure may also be incorporated as predetermined information in the calculation of the adjustment values, since also the transmission behavior of the reticule may predetermine a specific shape or symmetry of occurring image defects.

Figure 4:
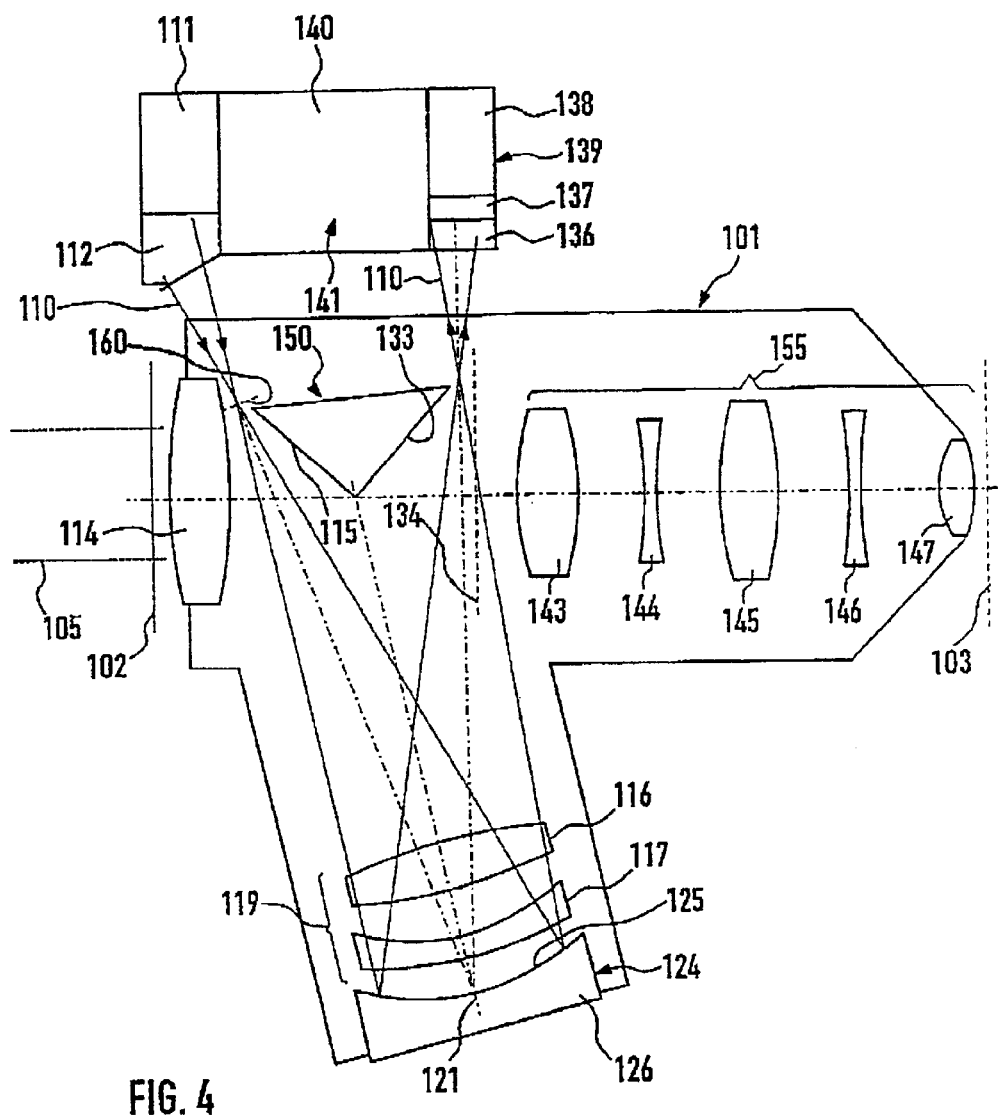
FIG. 4 is an alternative modification of a projection objective lens with a measuring and correction device for optical image defects.

An alternative embodiment of a measuring and correction device that cooperates with a projection objective lens is shown diagrammatically in FIG. 4. Structural elements that correspond to those that have already been described in connection with FIGS. 1 to 3 are identified by the relevant reference numerals plus 100 and will not be described again in detail.

The drive device for the individual lens 116 as well as the multiplex 130 and the associated connections and connection lines are omitted in FIG. 4.

Also in the embodiment of FIG. 4 the optical path of a measuring light partial bundle 110 is shown by way of example for the measuring light bundles that are used in the measuring and correction device.

Instead of two plane mirrors 15, 33 as in the embodiment according to FIG. 1, in the embodiment according to FIG. 4, a mirror prism 150 having two reflecting surfaces is used within the projection objective lens in order to deflect the bundles, wherein that reflecting surface of the mirror prism 150 that corresponds in each case to the plane mirror 15 and 33 is identified by the corresponding reference numeral 115 and 133.

The measuring light partial bundle 10 is not coupled and decoupled via mirrors in the projection objective lens 101, but for the coupling and decoupling is guided laterally past the reflecting surfaces 115 and 133 of the mirror prism 150 into and from the projection objective lens 1. The lens 114 is not traversed by the measuring light partial bundle 110.

The divergence of the measuring light partial bundle 110 as well as the location of a first collimation plane 160 that comprises the measuring light partial bundle 110 after the beam guidance optics 112 are matched to the projection objective lens 101 in such a way that they correspond to the numerical aperture of the projection objective lens 101 as well as to the position of the object plane 102.

The measuring light partial bundle 110 passes backwards and forwards through the group of lenses 119, which in this embodiment comprises only two lenses, namely 116, 117, a reflection at the reflecting layer 125 occurring between the forward passage and the reverse passage. In this region the optical path of the measuring light partial bundle 110 corresponds to that of the measuring light partial bundle 10 of FIG. 1, insofar as the solid beam of the measuring light partial bundle 110 is slightly inclined relative to the optical axis 121.

After the reverse passage through the group of lenses 119 the measuring light partial bundle 110 passes through the mirror prism 150 at the side opposite the coupling side. An image of the measuring light partial bundle is then formed by a detection optics 136 on a CCD array 137, so that here too a wave front deviation can be measured in a similar way as described in connection with FIG 1.

The group of lenses 155, which forms an image of the projection light bundle 105 in the image plane 103 after the intermediate image plane 134, comprises five individual lenses 143 to 147 in the embodiment shown in FIG. 4.

When extrapolating the modes of operation that have been described in connection with the measuring and correction device of FIG. 1 to FIG. 4, it should be borne in mind that the individual lens 114 is now no longer traversed by the measuring light bundles. Accordingly image defects for example of the individual lens 114 are not manifested in a wave front deviation measured with the correction sensor device 141. Therefore with this embodiment only image defects are detected that are produced by the optical surfaces of the group of lenses 119 as well as by the reflecting surface 125. This must be appropriately taken into account also in the extrapolation of the image changes of the overall projection objective lens 101 described in connection with FIG. 1.

Another possibility, not illustrated here, for coupling and decoupling the measuring light bundles in the region of the projection optics is a semi-reflecting mirror that can be installed at an arbitrary position in the optical path, and an optical system connected thereafter. The semi-reflecting mirror may for example be a dichroitic mirror that is transparent at the projection light wavelength and reflects the measuring light wavelength. If the semi-reflecting mirror does not allow the projection light to pass through completely, then the transmission of the overall objective lens is reduced.

TABLE 1

|  | RDY | THI | RMD | GLA |
|---|---|---|---|---|
| >OBJ: | INFINITY | 0.000000 |  |  |
| 1: | INFINITY | 34.000000 |  |  |
| 2: | 326.89134 | 18.000000 |  | 'CAF2' |
| 3: | 7134.75200 | 91.000000 |  |  |
| 4: | INFINITY | −438.917225 | REFL |  |
| XDE: | 0.000000 | YDE: 0.000000 | ZDE: 0.000000 | BEN |
| ADE: | 50.000000 | BDE: 0.000000 | CDE: 0.000000 |  |
| 5: | −386.39605 | −22.000000 |  | 'CAF2' |
| 6: | −3173.10800 | −23.000000 |  |  |
| 7: | 263.73446 | −13.000000 |  | 'CAF2' |
| 8: | −1274.99700 | −36.757293 |  |  |
| 9: | 173.05552 | −14.000000 |  | 'CAF2' |
| 10: | 398.57456 | −12.325630 |  |  |
| 11: | 246.26462 | 12.325630 | REFL |  |
| 12: | 398.57456 | 14.000000 |  | 'CAF2' |
| 13: | 173.05552 | 36.757293 |  |  |
| 14: | −1274.99700 | 13.000000 |  | 'CAF2' |
| 15: | 263.73446 | 23.000000 |  |  |
| 16: | −3173.10800 | 22.000000 |  | 'CAF2' |
| 17: | −386.39605 | 0.000000 |  |  |
| 18: | INFINITY | 435.917225 |  |  |
| 19: | INFINITY | 0.000000 | REFL |  |

TABLE 1-continued

|  | RDY | | THI | RMD | | GLA |  |
|---|---|---|---|---|---|---|---|
| XDE: | 0.000000 | YDE: | 0.000000 | ZDE: | 0.000000 | BEN | |
| ADE: | 40.000000 | BDE: | 0.000000 | CDE: | 0.000000 | | |
| 20: | INFINITY | | −78.197752 | | | | |
| 21: | INFINITY | | −40.000000 | | | | |
| 22: | INFINITY | | −19.962459 | | | | |
| 23: | −305.29233 | | −35.000000 | | | 'CAF2' | |
| ASP: | | | | | | | |
| K: | 0.000000 | | | | | | |
| IC: | YES | CUF: | 0.000000 | | | | |
| A: | 0.983943E−08 | B: | −.197982E−13 | C: | −.331141E−17 | D: | 0.546921E−21 |
| E: | −.476299E−25 | F: | 0.165982E−29 | G: | 0.000000E+00 | H: | 0.000000E+00 |
| J: | 0.000000E+00 | | | | | | |
| 24: | 609.90977 | | 175.000000 | | | | |
| 25: | 211.27437 | | −20.000000 | | | 'CAF2' | |
| 26: | 296.93430 | | −1.000000 | | | | |
| 27: | −918.04784 | | −32.000000 | | | 'CAF2' | |
| 28: | 450.01625 | | −10.220682 | | | | |
| 29: | −211.00994 | | −35.000041 | | | 'CAF2' | |
| 30: | −147.86638 | | −291.880529 | | | | |
| ASP: | | | | | | | |
| K: | 0.000000 | | | | | | |
| IC: | YES | CUF: | 0.000000 | | | | |
| A: | −.102239E−07 | B: | −.375361E−12 | C: | −.202452E−16 | D: | 0.158059E−22 |
| E: | −.105932E−24 | F: | 0.746588E−30 | G: | 0.000000E+00 | H: | 0.000000E+00 |
| J: | 0.000000E+00 | | | | | | |
| 31: | −302.52916 | | −14.999813 | | | 'CAF2' | |
| 32: | −182.15262 | | −32.488787 | | | | |
| 33: | −325.54311 | | −32.000000 | | | 'CAF2' | |
| 34: | 472.69366 | | −3.402424 | | | | |
| 35: | −132.72874 | | −19.621815 | | | 'CAF2' | |
| 36: | −197.27963 | | 0.000000 | | | | |
| ASP: | | | | | | | |
| K: | 0.000000 | | | | | | |
| IC: | YES | CUF: | 0.000000 | | | | |
| A: | −.132547E−07 | B: | −.196227E−12 | C: | −.495156E−17 | D: | −.179425E−21 |
| E: | −.681679E−25 | F: | −.439118E−29 | G: | 0.000000E+00 | H: | 0.000000E+00 |
| J: | 0.000000E+00 | | | | | | |
| STO: | INFINITY | | −50.801191 | | | | |
| 38: | −1247.88900 | | −21.000000 | | | 'CAF2' | |
| 39: | 441.06952 | | −1.000000 | | | | |
| 40: | −106.43847 | | −30.279452 | | | 'CAF2' | |
| 41: | −390.31325 | | −17.376730 | | | | |
| 42: | 262.38753 | | −10.000000 | | | 'CAF2' | |
| 43: | −8245.04000 | | −1.000000 | | | | |
| 44: | −105.22412 | | −35.374148 | | | 'CAF2' | |
| 45: | −380.86930 | | −1.000000 | | | | |
| 46: | −131.60165 | | −36.324916 | | | 'CAF2' | |
| 47: | 9747.89700 | | −12.069886 | | | | |
| ASP: | | | | | | | |
| K: | 0.000000 | | | | | | |
| IC: | YES | CUF: | 0.000000 | | | | |
| A: | −.179402E−06 | B: | 0.398734E−10 | C: | 0.217607E−13 | D: | −.684630E−16 |
| E: | 0.703555E−19 | F: | −.266200E−22 | G: | 0.000000E+00 | H: | 0.000000E+00 |
| J: | 0.000000E−00 | | | | | | |
| IMG: | INFINITY | | 0.000355 | | | | |

What is claimed is:

1. A projection exposure system, in particular for microlithography, for producing an image in an image plane of an object arranged in an object plane wherein the system comprises:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, and b) a position-sensitive correction sensor element for detecting the wave front of the at least one measuring light bundle, wherein the projection optics are designed so that they contain at least one intermediate image plane and that the correction sensor element lies in the intermediate image plane or in a plane conjugated thereto.

2. A projection exposure system, in particular for microlithography, for producing an image in an image plane of an object arranged in an object plane wherein the system comprises:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, and b) a position-sensitive correction sensor element for detecting the wave front of the at least one measuring light bundle, wherein the correction sensor device comprises an adjustment manipulator for the adjustment of the correction sensor device relative to the projection optics.

3. A projection exposure system, in particular for microlithography, for producing an image in an image plane of an object arranged in an object plane wherein the system comprises:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, and b) a position-sensitive correction sensor element for detecting the wave front of the at least one measuring light bundle, wherein one or more of the at least one optical correction component is an active mirror.

4. The projection exposure system according to claim 3, characterized in that the active mirror comprises a multiplicity of mirror facets that can be displaced independently of one another by means of correction manipulators.

5. The projection exposure system according to claim 3, characterized in that the active mirror comprises a deformable reflecting surface.

6. A projection exposure system, in particular for microlithography, for producing an image in an image plane of an object arranged in an object plane wherein the system comprises:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, and b) a position-sensitive correction sensor element for detecting the wave front of the at least one measuring light bundle wherein the optical correction component is a at least one lens that is designed so that it can be displaced using the correction manipulator, the at least one lens being displaceable perpendicular to its optical axis.

7. A process for the compensation of image defects occurring in the projection optics of a projection exposure system, in particular for microlithography, comprising the steps of:

a) providing at least one measuring light bundle guided through at least a part of the projection optics independently from the projection light bundle;

b) measuring the optical properties of the measuring light bundle after the at least partial passage through the projection optics;

c) measuring the wave front of the measuring light bundle in at least one of an intermediate image plane and in a plane conjugated thereto;

d) comparing the measured value with at least one predetermined desired value; and e) adjusting the measured optical property depending on the comparison with at least one correction component influencing the optical property.

8. A process for the compensation of image defects occurring in the projection optics of a projection exposure system, in particular for microlithography, comprising the steps of:

a) providing at least one measuring light bundle guided through at least a part of the projection optics independently from the projection light bundle;

b) measuring the optical properties of the measuring light bundle after the at least partial passage through the projection optics;

c) comparing the measured value with at least one predetermined desired value;

d) adjusting the measured optical property depending on the comparison with at least one correction component influencing the optical property;

e) determining a deviation between a desired reflecting surface and an actual reflecting surface of a mirror of the projection optics, from the measured values;

f) calculating adjustment values for the actual reflecting surface; and g) shaping the actual reflecting surface corresponding to the calculated adjustment values.

9. A projection exposure system, in particular for microlithography, for producing an image in an image plane of an object arranged in an object plane wherein the system comprises:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, b) a position-sensitive correction sensor element for detecting the wave front of the at least one measuring light bundle, and c) means for adjusting the optical properties of a measuring light bundle passing through the projection optics that takes into account expected image defects of optical components that affect the projection light bundle, but not the measuring light bundle, wherein the projection optics are designed so that they contain at least one intermediate image plane and that the correction sensor element lies in the intermediate image plane or in a plane conjugated thereto.

10. A process for the compensation of image defects occurring in the projection optics of a projection exposure system, in particular for microlithography, the projection exposure system comprising:

a light source emitting a projection light bundle, with at least one projection optics arranged in an optical path between its object plane and its image plane and with at least one optical correction component arranged in said optical path in front of the image plane, which in order to change optical image properties in the projection is coupled to at least one correction manipulator in such a way that an optical surface of the optical correction component illuminated by the projection light bundle is moved at least regionally, wherein the correction manipulator co-operates with a correction sensor device in order to determine the optical image properties in the projection, said correction sensor device comprising:

a) a light source that emits at least one measuring light bundle that traverses at least a part of the projection optics and that lies in front of the entry to the projection optics and behind the exit from the projection optics outside the projection light bundle, and b) a position-sensitive correction sensor element for detecting the wave front of the at least one measuring light bundle;

wherein the projection optics are designed so that they contain at least one intermediate image plane and that the correction sensor element lies in the intermediate image plane or in a plane conjugated thereto;

the process comprising the steps of:

a) providing at least one measuring light bundle guided through at least a part of the projection optics independently from the projection light bundle;

b) measuring the optical properties of the measuring light bundle after the at least partial passage through the projection optics;

c) comparing the measured value with at least one predetermined desired value; and d) adjusting the measured optical property depending on the comparison with at least one correction component influencing the optical property, wherein the step of adjusting is performed by taking into account in addition expected image defects of optical components that affect the projection light bundle but not be measuring light bundle.

11. The method according to claim 10, wherein the step of comparing the measured value with at least one predetermined value includes the step of presetting the projection optics with the desired value, wherein the desired value is determined, at least in part, on a known lighting setting.

12. The method according to claim 10, wherein the step of comparing the measured value with at least one predetermined value includes the step of presetting the projection optics with the desired value, wherein the desired value is determined, at least in part, on a type of object being transmitted.

* * * * *